(12) United States Patent  
Watanabe et al.

(10) Patent No.: US 9,111,644 B2
(45) Date of Patent: Aug. 18, 2015

(54) READOUT CIRCUIT AND SEMICONDUCTOR DEVICE

(71) Applicant: Seiko Instruments Inc., Chiba-shi, Chiba (JP)

(72) Inventors: Kotaro Watanabe, Chiba (JP); Makoto Mitani, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 31 days.

(21) Appl. No.: 14/029,251

(22) Filed: Sep. 17, 2013

(65) Prior Publication Data

US 2014/0085996 A1    Mar. 27, 2014

(30) Foreign Application Priority Data

Sep. 26, 2012   (JP) .................................. 2012-212942

(51) Int. Cl.
 *G11C 29/04*   (2006.01)
 *G11C 7/02*    (2006.01)
 *G11C 7/10*    (2006.01)
(52) U.S. Cl.
 CPC   *G11C 29/04* (2013.01); *G11C 7/02* (2013.01); *G11C 7/106* (2013.01); *G11C 7/1063* (2013.01)

(58) Field of Classification Search
 CPC ........................................................ G11C 29/04
 USPC ............................................ 365/189.15, 201
 See application file for complete search history.

(56) References Cited

U.S. PATENT DOCUMENTS

| 2004/0213050 | A1* | 10/2004 | Fukuoka et al. | ......... 365/189.05 |
| 2006/0152269 | A1* | 7/2006 | Marutani | ....................... 327/218 |
| 2010/0208531 | A1* | 8/2010 | Watanabe | ................ 365/189.15 |

FOREIGN PATENT DOCUMENTS

JP   2010-192039 A   9/2010

* cited by examiner

*Primary Examiner* — Huan Hoang
*Assistant Examiner* — Muna Techane
(74) *Attorney, Agent, or Firm* — Brinks Gilson & Lione

(57) ABSTRACT

Provided is a readout circuit capable of detecting inversion of retained data caused by a noise, such as static electricity. The readout circuit is configured to retain opposing data in a first latch circuit and a second latch circuit in a readout period so as to be capable of detecting an anomaly of the retained data by making use of the fact that the data in the first latch circuit and the second latch circuit are inverted in the same direction due to a noise, such as static electricity.

6 Claims, 3 Drawing Sheets

READOUT CIRCUIT AND SEMICONDUCTOR DEVICE

RELATED APPLICATIONS

This application claims priority under 35 U.S.C. §119 to Japanese Patent Application No. 2012-212942 filed on Sep. 26, 2012, the entire content of which is hereby incorporated by reference.

BACKGROUND OF THE INVENTION

Field of the Invention

The present invention relates to a readout circuit and a semiconductor device that read out data from a semiconductor memory element and retain the data, and more particularly, to a readout circuit provided with a function for detecting that retained data has been inverted by a noise, such as static electricity.

FIG. 3 is a circuit diagram illustrating a conventional readout circuit that reads data from a semiconductor memory element. The conventional readout circuit includes a first switch 32, a second switch 33, and a latch circuit 34. A memory element 31 is, for example, a nonvolatile semiconductor memory.

The first switch 32 is connected between the memory element 31 and a readout terminal OUT, and controlled by a control signal Φ1. The second switch 33 is connected between the readout terminal OUT and a grounding terminal, and controlled by a control signal Φ2. The latch circuit 34 is connected to the readout terminal OUT.

The conventional readout circuit reads data from the memory element 31 to the readout terminal OUT and retains the data in the latch circuit 34 as described below.

First, the voltage at the readout terminal OUT and the data in the latch circuit 34 are initialized by the second switch 33. Then, the first switch 32 turns on, thus causing the data in the memory element 31 to be output to the readout terminal OUT. At the same time, the latch circuit 34 retains the data from the memory element 31. Even after the first switch 32 is turned off, the data from the memory element 31 is output to the readout terminal OUT (refer to, for example, patent document 1).

[Patent Document 1] Japanese Patent Application Laid-Open No. 2010-192039

However, the conventional readout circuit has been posing a problem in that if data is inverted due to a noise, such as static electricity, after the data from the memory element 31 is retained by the latch circuit 34, then no means is available for detecting the inversion of the data, so that erroneous data continues to be output from the readout terminal OUT.

SUMMARY OF THE INVENTION

The present invention has been made with a view toward solving the problem described above, and provides a readout circuit and a semiconductor device that prevent erroneous data from being continued to be output from a readout terminal OUT in the case where data in the latch circuit 34 is inverted due to a noise, such as static electricity.

To solve the problem described above, a readout circuit according to the present invention is configured to retain opposing data in a first latch circuit and a second latch circuit during a readout period so as to permit detection of an anomaly of retained data by making use of the fact that a noise, such as static electricity, causes the data to be inverted in the same direction.

The readout circuit according to the present invention is capable of detecting that data in latch circuits have been inverted due to a noise, such as static electricity. Thus, erroneous data will not be continued to be output from a readout terminal OUT, thus making it possible to provide a highly reliable semiconductor device.

DETAILED DESCRIPTION OF THE PREFERRED EMBODIMENTS

Figure 1:
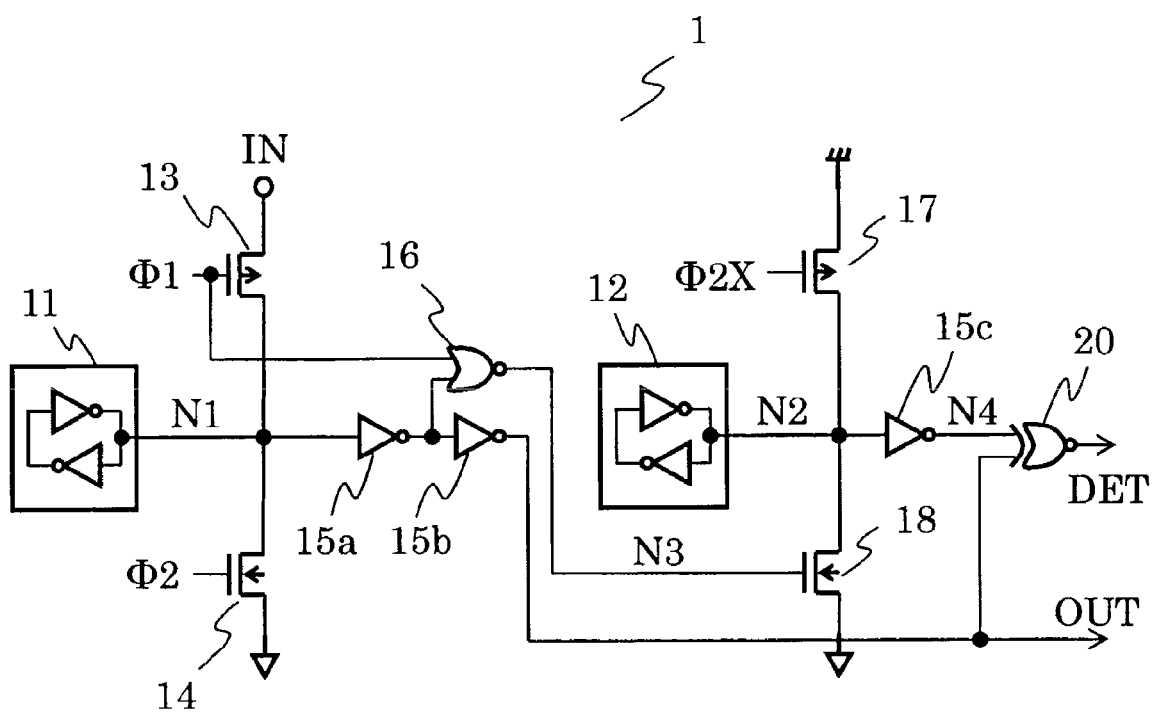
FIG. 1 is a circuit diagram illustrating a readout circuit according to an embodiment.

FIG. 1 is a circuit diagram illustrating the readout circuit according to an embodiment of the present invention. A readout circuit 1 according to the present embodiment includes a first latch circuit 11, a second latch circuit 12, a first switch 13, a second switch 14, inverters 15a, 15b, 15c, a NOR circuit 16, a third switch 17, a fourth switch 18, and an XNOR circuit 20.

The first latch circuit 11 is connected to a first node N1. The first switch 13 is connected between the first node N1 and an input terminal IN and controlled by a control signal Φ1. The second switch 14 is connected between the first node N1 and a grounding terminal and controlled by a control signal Φ2. The input terminal of the inverter 15a is connected to the first node N1. The output terminal of the inverter 15a is connected to the input terminal of the inverter 15b, and an output terminal OUT, which outputs data in the latch circuit 11, is connected to the output terminal of the inverter 15b. The output terminal of the inverter 15a is connected to one input terminal of the NOR circuit 16, and the control signal Φ1 is supplied to the other input terminal of the NOR circuit 16. The third switch 17 is connected between a second node N2 and a power terminal, and controlled by a control signal Φ2X, which is an inversion of the control signal Φ2. The fourth switch 18 is connected between the second node N2 and a grounding terminal and controlled by a signal at an output terminal of the NOR circuit 16 (a third node N3). The input terminal of the inverter 15c is connected to the second node N2. The XNOR 20, which is a detection circuit, has the output terminal of the inverter 15b (a fourth node N4) connected to one input terminal thereof, the output terminal of the inverter 15c connected to the other input terminal thereof, and a detection terminal DET connected to the output terminal thereof. The detection terminal DET is a terminal that outputs a detection signal indicating an anomaly of data in the latch circuit.

The readout circuit 1 according to the present embodiment has, for example, a nonvolatile semiconductor memory connected to the input terminal IN thereof to read data from the nonvolatile semiconductor memory by the control signals Φ1 and Φ2 into the first latch circuit 11 and the second latch circuit 12, and outputs the data to a circuit in a subsequent stage connected to the output terminal OUT. Further, the readout circuit 1 detects that the data read into the first latch circuit 11 has been inverted due to a noise, such as static electricity, and outputs a detection signal from the detection terminal DET to the circuit in the subsequent stage. If the detection signal goes low, it means that the data in the latch circuit has incurred an anomaly. The circuit in the subsequent stage carries out control to read the data in the semiconductor memory into the readout circuit 1 at regular intervals to ensure reliability. The circuit in the subsequent stage is also capable of carrying out control such that the data in the semiconductor memory is read into the readout circuit 1 if an anomaly of the data in the latch circuit is detected by a detection signal at the detection terminal DET.

Figure 2:
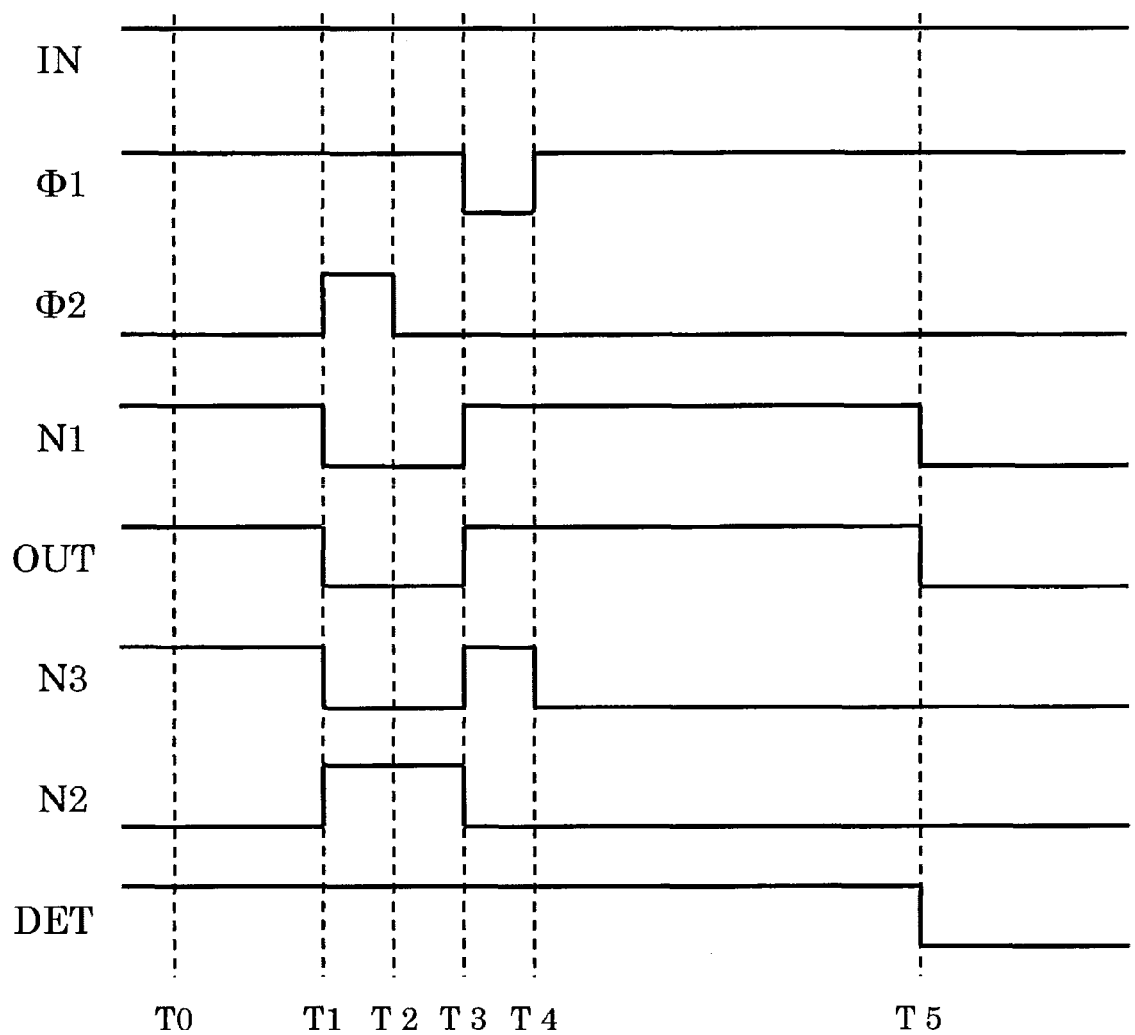
FIG. 2 is a timing chart illustrating the operation of the readout circuit according to the embodiment.
Figure 3:
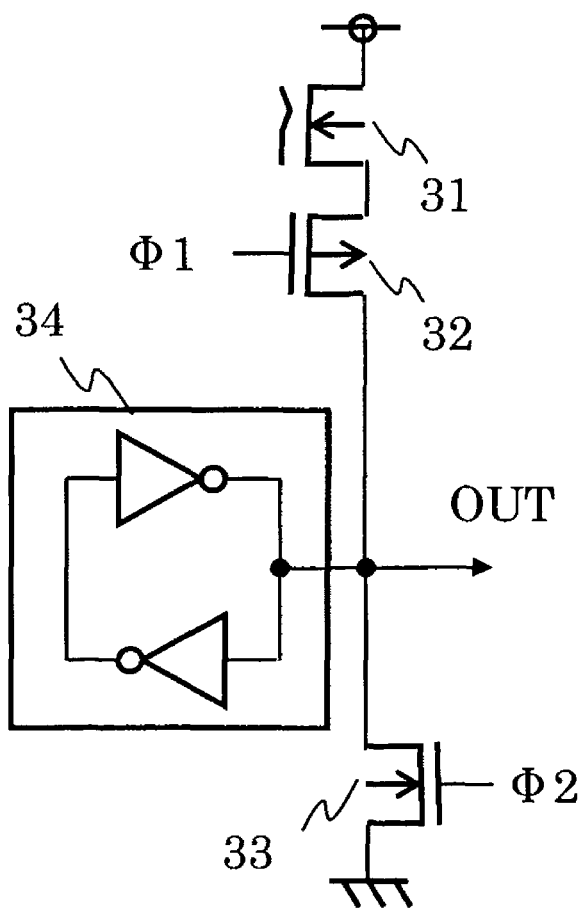
FIG. 3 is a circuit diagram of a conventional readout circuit.

FIG. 2 is a timing chart illustrating the operation of the readout circuit according to the present embodiment.

The following will describe the operation of the readout circuit in a state wherein high data has been supplied to the input terminal IN.

At time T0, all signals maintain previous regular readout states. The period from time T1 to time T4 is the regular readout period. Then, a noise, such as static electricity, is applied to the semiconductor device at time T5, causing the data in the first latch circuit 11 to be inverted.

At time T1, the control signal Φ1 goes high and the second switch 14 turns on to initialize the first node N1 to low, thus causing the data in the first latch circuit 11 to also become low. When the first node N1 goes low, the inverter 15a goes high, the inverter 15b outputs low, and the output terminal OUT outputs low. The NOR circuit 16 outputs low to the output terminal thereof (the third node N3), because the input control signal Φ2 and the output signal of the inverter 15a both go high. This turns the fourth switch 18 off. The control signal Φ2X goes low, since it is the inverted signal of the control signal Φ2. This causes the third switch 17 to turn on to initialize the second node N2 to high and also causes the data in the second latch circuit 12 to go high. When the second node N2 goes high, the output of the inverter 15c (the fourth node N4) goes low. The output terminal OUT and the fourth node N4 both go low, so that the XNOR circuit 20 outputs high from the output terminal thereof and the detection signal of the detection terminal DET will be maintained at high.

At time T2, the control signal Φ2 goes low, while the control signal Φ2X goes high, causing the second switch 14 and the third switch 17 to turn off. The first latch circuit 11 holds the first node N1 at low. Further, the second latch circuit 12 holds the second node N2 at high.

At time T3, the control signal Φ1 goes low, the first switch 13 turns on, and the readout circuit 1 reads the data from the semiconductor memory connected to the input terminal IN thereof into the first latch circuit 11. In this case, the data supplied to the input terminal IN is high, so that the first node N1 goes high and the data in the first latch circuit 11 also goes high. When the first node N1 goes high, the inverter 15a outputs low, while the inverter 15b outputs high, and the output terminal OUT outputs high. The NOR circuit 16 outputs high to the output terminal (the third node N3), because the input control signal Φ2 and the output signal of the inverter 15a both go low. Thus, the fourth switch 18 turns on to set the second node N2 and the data in the second latch circuit 12 to be low. When the second node N2 goes low, the output of the inverter 15c (the fourth node N4) goes high. The output terminal OUT and the fourth node N4 both go high, so that the XNOR circuit 20 outputs high from the output terminal thereof and the detection signal at the detection terminal DET is maintained at high.

At time T4, the control signal Φ1 goes high, turning the first switch 13 off. The first latch circuit 11 maintains the first node N1 at high. Further, since the output of the NOR circuit 16 goes low, the fourth switch 18 turns off, while the second node N2 is held at low by the second latch circuit 12.

The timing chart of the period from time T1 to time T4 described above indicates the operation of the readout circuit 1 during the readout period.

A description will now be given of the operation performed when a noise, such as static electricity, is applied and the data in the latch circuits are inverted at time T5.

The noise, such as static electricity, may cause the data in the first latch circuit 11 and the second latch circuit 12 to be inverted. The first latch circuit 11 and the second latch circuit 12 share the same circuit configuration, so that if the data is inverted, then the data will be inverted to the same value. Accordingly, if the data in the first latch circuit 11 is inverted from high to low, then the data in the second latch circuit 12 will remain low without being inverted.

If the data in the first latch circuit 11 is inverted to low, then the inverter 15a outputs high and the inverter 15b outputs low, causing the output terminal OUT to output erroneous data low. At this time, since the data in the second latch circuit 12 remains low, the fourth node N4 is high. The XNOR circuit 20 outputs low from the output terminal thereof and the detection signal at the detection terminal DET goes low, because the data at the output terminal OUT is low and the fourth node N4 is high.

As described above, the readout circuit 1 according to the present embodiment is capable of detecting the inversion of the data in the latch circuits and issuing the detection signal (low) at the detection terminal DET. This arrangement enables the circuit connected to a subsequent stage to detect anomalies of the latch circuits, thus permitting control such that the readout circuit 1 reads the data from the semiconductor memory by controlling the control signals Φ1 and Φ2.

In the present embodiment, the description has been given of the case where the data supplied to the input terminal IN is high. However, the readout circuit 1 is also capable of detecting an anomaly of the latch circuits even in the case where data is low or Hi-Z.

Further, in the readout circuit 1 according to the present embodiment, the first latch circuit 11 and the second latch circuit 12 preferably share the same power supply line or are preferably disposed adjacently so as to be inverted in the same direction when subjected to a noise, such as static electricity. Further, the latch circuits and the switches preferably share like configurations or layouts.

The circuit configuration of the readout circuit 1 according to the present embodiment is an example, and the present invention is not limited to the aforesaid circuit configuration. The present invention can be applied to other circuit configurations as long as the first latch circuit 11 and the second latch circuit 12 retain opposing data during a readout period so as to make it possible to detect an anomaly of the retained data by making use of the fact that the data is inverted in the same direction due to a noise, such as static electricity.

What is claimed is:

1. A readout circuit comprising:
a first switch that reads data at an input terminal;
a first latch circuit that retains the data read by the first switch;
a second switch that initializes data in the first latch circuit; and
an output terminal connected to the first latch circuit that outputs the data in the first latch circuit,
wherein the readout circuit further comprises:
a second latch circuit that retains data obtained by inverting the data in the first latch circuit; and
a detection circuit having a first input connected to the first latch circuit and a second input connected to the second latch circuit, that detects a data anomaly, in which either the data in the first latch circuit or the data in the second latch circuit is inverted, and the detection circuit having an output connected to a detection terminal and outputs a detection signal from the detection terminal upon detection of a data anomaly.

2. The readout circuit according to claim 1, comprising:
a third switch that initializes the second latch circuit to data obtained by inverting initial data in the first latch circuit; and
a fourth switch that inverts the data in the second latch circuit in the case where the data retained in the first latch circuit and initial data in the second latch circuit are the same.

3. The readout circuit according to claim 1, wherein the first latch circuit and the second latch circuit share the same power supply line and are adjacently disposed.

4. The readout circuit according to claim 2, wherein the first latch circuit and the second latch circuit share the same power supply line and are adjacently disposed.

5. A semiconductor device comprising:
a memory element connected to the input terminal; and
the readout circuit according to claim 1 that retains data read from the memory element and detects an anomaly of the retained data.

6. The readout circuit according to claim 1, wherein the detection circuit comprises an XNOR circuit.

* * * * *